US008363301B2

(12) United States Patent
Lee et al.

(10) Patent No.: US 8,363,301 B2
(45) Date of Patent: Jan. 29, 2013

(54) TRANSPARENT SMART LIGHT SOURCE CAPABLE OF ADJUSTING ILLUMINATION DIRECTION

(75) Inventors: Jeong Ik Lee, Gyeonggi-do (KR); Hye Yong Chu, Daejeon (KR); Jong Hee Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 275 days.

(21) Appl. No.: 12/816,858

(22) Filed: Jun. 16, 2010

(65) Prior Publication Data

US 2011/0310458 A1    Dec. 22, 2011

(51) Int. Cl.
*G02F 1/15* (2006.01)
(52) U.S. Cl. ........................................... 359/265
(58) Field of Classification Search .......... 359/265; 362/296.01, 307, 296.02, 311.01, 311.02, 362/311.03
See application file for complete search history.

(56) References Cited

U.S. PATENT DOCUMENTS

| 7,405,864 | B2 | 7/2008 | Uchida |
| 7,545,551 | B2 * | 6/2009 | Yoshimura et al. ........... 359/273 |
| 2004/0185195 | A1 * | 9/2004 | Anderson et al. ............... 428/34 |
| 2008/0111958 | A1 | 5/2008 | Kleverman et al. |
| 2008/0163923 | A1 | 7/2008 | Park et al. |
| 2008/0186560 | A1 | 8/2008 | Kim |

FOREIGN PATENT DOCUMENTS

| JP | 2006-106343 A | 4/2006 |
| KR | 2004-0033210 | 4/2004 |
| KR | 2007-0048092 A | 5/2007 |
| KR | 2008-0065120 A | 7/2008 |
| KR | 2009-0009465 | 1/2009 |

OTHER PUBLICATIONS

Annemarie van Geest-Lokhorst, "Reflections on switchable mirror devices", pp. 1 to 135, Jun. 14, 2006.

* cited by examiner

*Primary Examiner* — Joseph P Martinez
(74) *Attorney, Agent, or Firm* — Rabin & Berdo, P.C.

(57) ABSTRACT

A transparent smart light source capable of adjusting an illumination direction is provided. The transparent smart light source includes a reflectance/transmittance tunable device that adjusts an illumination direction by reflecting or transmitting light emitted from a transparent organic light-emitting diode (OLED) according to applied voltage, and thus can simply adjust the illumination direction according to purpose. Accordingly, it is possible to prevent optical loss in an unnecessary direction, and power consumption can be reduced. Furthermore, the transparent smart light source can serve as a curtain blocking out external light, as well as a lighting device, and also can be combined with a solar cell to generate electric power.

13 Claims, 5 Drawing Sheets

TRANSPARENT STATE

NON-TRANSPARENT STATE

REFLECTIVE STATE

TRANSPARENT SMART LIGHT SOURCE CAPABLE OF ADJUSTING ILLUMINATION DIRECTION

BACKGROUND

1. Field of the Invention

The present invention relates to a transparent smart light source capable of adjusting an illumination direction, and more particularly to a transparent smart light source configured to adjust an illumination direction using a device capable of adjusting reflectance and transmittance.

2. Discussion of Related Art

After the advent of incandescent lamps and fluorescent lamps, light-emitting diodes (LEDs) have recently attracted attention. In the early stage, the LEDs have problems of low brightness and poor color characteristics. However, with the development of technology, the LEDs have been developed to have high efficiency and excellent color characteristics and put to practical use.

Light sources that are currently under active development after the LEDs are organic light-emitting diodes (OLEDs) that emit light using an organic semiconductor material. Since the OLEDs have a small thickness, small weight, and a rapid response speed, application to a backlight unit (BLU) of a liquid crystal display (LCD) as well as a general lighting device is under active development.

FIG. 1 is a schematic cross-sectional view of an OLED 100.

Referring to FIG. 1, the OLED 100 is a self light-emitting device in which holes injected from an anode electrode and electrons injected from a cathode electrode 170 are combined to form excitons at an organic light-emitting layer 150, and the excitons emit light while releasing energy.

When both of the anode electrode 130 and the cathode electrode 170 are transparent electrodes, it is possible to fabricate a transparent OLED capable of bottom emission and top emission both. Lately, a smart light source in which such a transparent OLED is integrated with glass or windows is under development.

However, a transparent OLED emits light in two opposite directions. Thus, when a surface light source is implemented using a transparent OLED, even if light emission is needed in only one direction, light is emitted unnecessarily in the other direction and optical loss occurs.

For example, when a transparent OLED is applied to a window, light is emitted to the inside and outside of a building. Here, the light emitted to the outside fails to contribute indoor lighting, and causes the dissipation of energy.

SUMMARY OF THE INVENTION

The present invention is directed to a transparent smart light source that can adjust an illumination direction and thus can be applied to various purposes and environments.

One aspect of the present invention provides a transparent smart light source capable of adjusting an illumination direction including: a transparent organic light-emitting diode (OLED) for bidirectional emission of top emission and bottom emission; and a reflectance/transmittance tunable device having reflectance/transmittance varying according to a polarity and level of an applied voltage, and reflecting or transmitting light emitted from the transparent OLED to adjust the illumination direction.

The transparent smart light source may further include a solar cell for generating electric power using sunlight from the outside.

The reflectance/transmittance tunable device may be integrated on at least one of lower and upper surfaces of the transparent OLED.

The reflectance/transmittance of the reflectance/transmittance tunable device may be varied according to the polarity and level of the applied voltage to place the reflectance/transmittance tunable device in a transparent state, a non-transparent state, or a reflective state, and the transparent OLED may emit light in both directions when the reflectance/transmittance tunable device is in the transparent state, and in a direction opposite to the reflectance/transmittance tunable device when the reflectance/transmittance tunable device is in the reflective state.

In an exemplary embodiment, the reflectance/transmittance tunable device may include: a first glass substrate; a thin metal layer formed on the first glass substrate and reacting with hydrogen ions to be transparent; an electrolyte layer for supplying hydrogen ions to the thin metal layer, or receiving hydrogen ions from the thin metal layer and storing the received hydrogen ions; a thin transparent layer formed to correspond to the thin metal layer with the electrolyte layer interposed therebetween; and a second glass substrate formed on the thin transparent layer. Here, the thin metal layer may be formed of Gd—Mg or Mg—Ni, which becomes transparent upon reaction with hydrogen ions.

In another exemplary embodiment, the reflectance/transmittance tunable device may be smart glass whose reflectance/transmittance vary according to the applied voltage.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

Throughout this specification, when an element is referred to as being "connected" or "coupled" to another element, it can be directly connected or coupled to the other element or electrically connected or coupled to the other element with yet another element interposed between them.

Throughout this specification, when an element is referred to as "comprises," "includes," or "has" a component, it does not preclude another component but may further include the other component unless the context clearly indicates otherwise. Also, as used herein, the terms ". . . unit," ". . . device," ". . . module," etc., denote a unit of processing at least one function or operation, and may be implemented as hardware, software, or combination of hardware and software.

Figure 2:
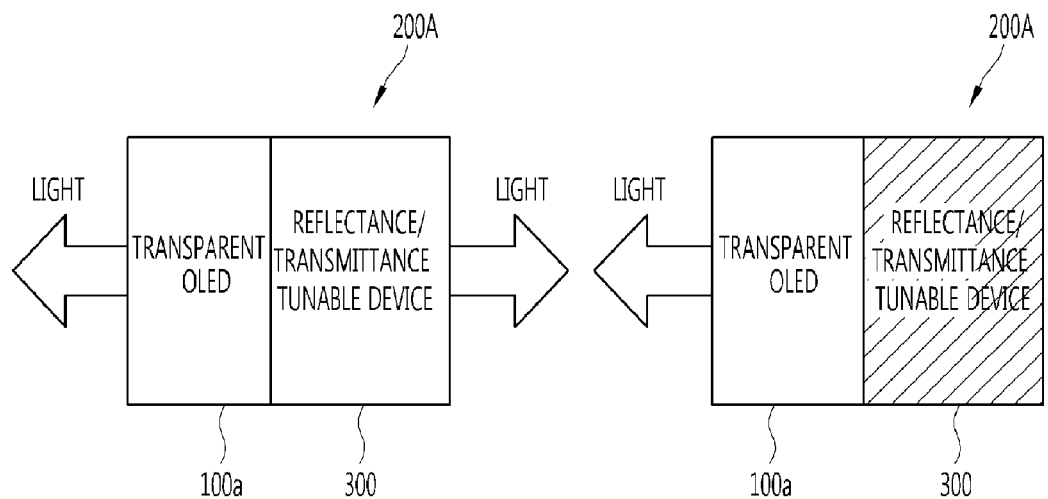
FIG. 2 schematically illustrates a transparent smart light source according to a first exemplary embodiment of the present invention.

FIG. 2 schematically illustrates a transparent smart light source 200A according to a first exemplary embodiment of the present invention.

Referring to FIG. 2, the transparent smart light source 200A according to the first exemplary embodiment of the present invention has a structure in which a reflectance/transmittance tunable device 300 is integrated into a transparent organic light-emitting diode (OLED) 100a capable of emitting light in both directions.

Figure 1:
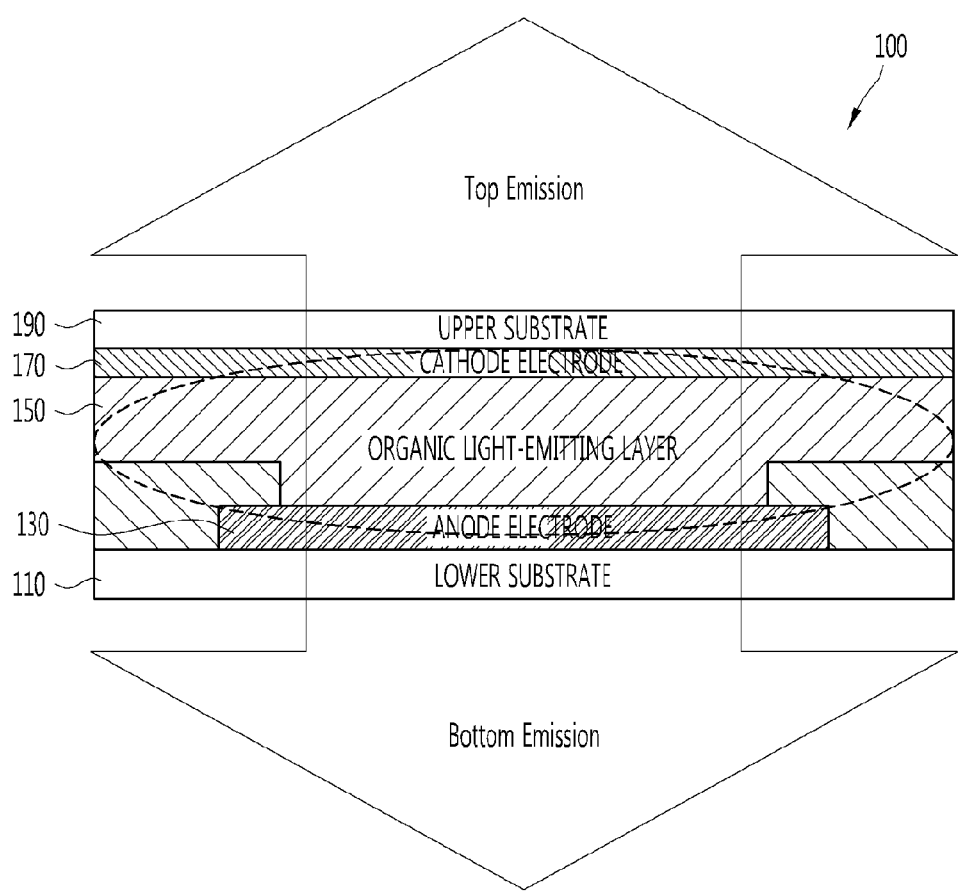
FIG. 1 is a schematic cross-sectional view of an organic light-emitting diode (OLED)

Since the transparent OLED 100a has the same constitution and operates in the same way as the OLED 100 shown in FIG. 1, the detailed description will not be reiterated.

The reflectance/transmittance of the reflectance/transmittance tunable device 300 vary according to the polarity and level of applied voltage, thereby reflecting or transmitting light emitted from the transparent OLED 100a, which will be described in further detail below.

Figure 3A:
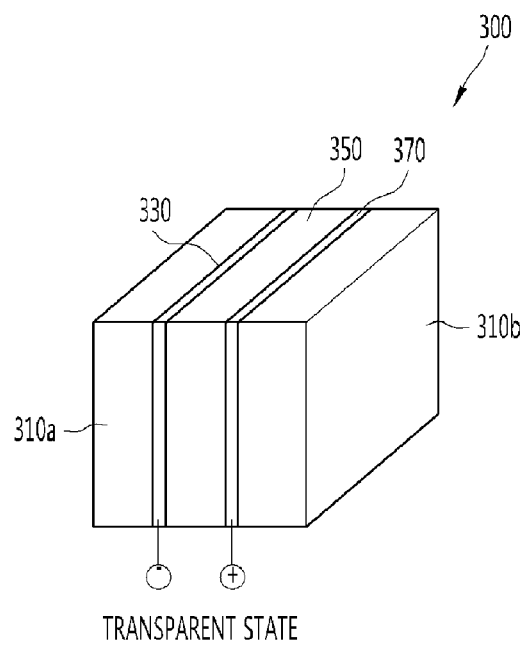
FIGS. 3A to 3C illustrate the constitution and operation of a reflectance/transmittance tunable device of FIG. 2.
Figure 3B:
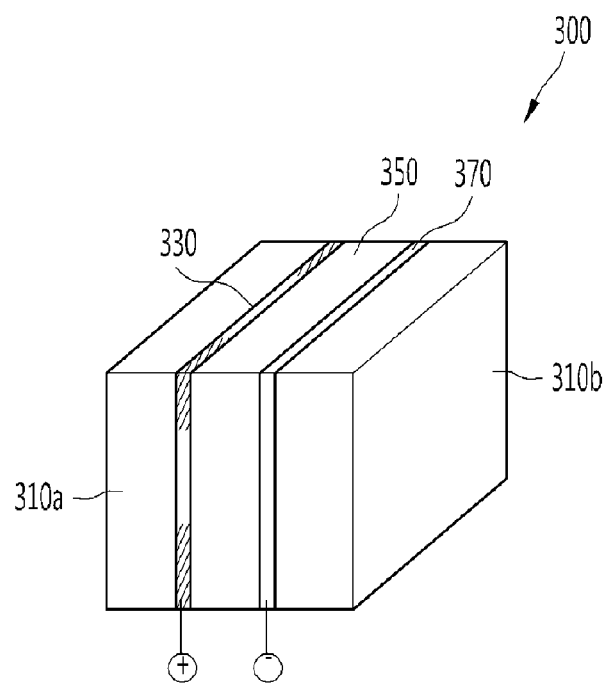
Figure 3C:
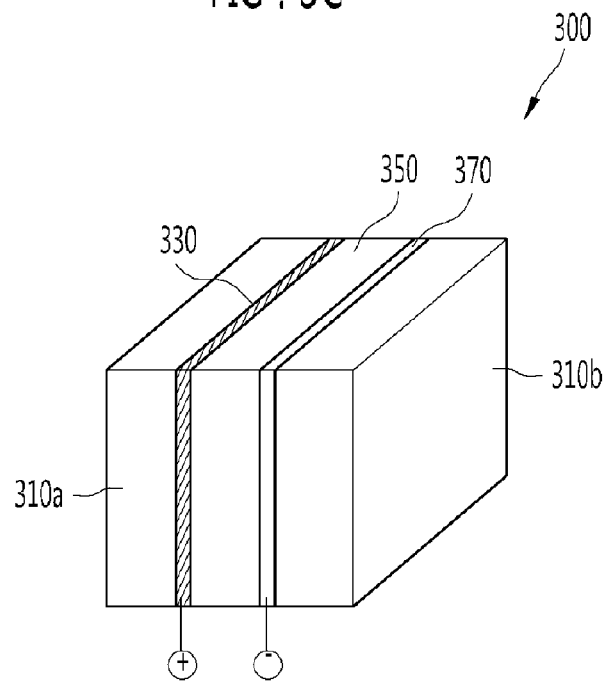

FIGS. 3A to 3C illustrate the constitution and operation of the reflectance/transmittance tunable device 300 of FIG. 2.

Referring to FIGS. 3A to 3C, the reflectance/transmittance tunable device 300 includes a first glass substrate 310a, a thin metal layer 330 that is formed on the first glass substrate 310a and reacts with hydrogen ions to be transparent, an electrolyte layer 350 that supplies hydrogen ions to the thin metal layer 330, or receives hydrogen ions from the thin metal layer 330 and stores the received hydrogen ions, a thin transparent layer 370 that is formed to correspond to the thin metal layer 330 with respect to the electrolyte layer 350, and a second glass substrate 310b formed on the thin transparent layer 370.

In other words, the reflectance/transmittance tunable device 300 has a structure in which the thin metal layer 330 and the thin transparent layer 370 are formed between the first and second glass substrates 310a and 310b with the electrolyte layer 350 interposed between the thin metal layer 330 and the thin transparent layer 370.

Here, the thin metal layer 330 may be formed of metal, such as Gd—Mg or Mg—Ni, that becomes transparent upon reaction with hydrogen ions, and the thin transparent layer 370 may be formed of indium-tin oxide (ITO).

The thin metal layer 330 may be placed in a transparent state, a non-transparent state, or a reflective state according to the polarity and level of applied voltage. This operation will be described in detail below.

First, when voltages of (−) polarity and (+) polarity are applied to the thin metal layer 330 and the thin transparent layer 370 respectively as shown in FIG. 3A, hydrogen ions are supplied from the electrolyte layer 350 to the thin metal layer 330, and the thin metal layer 330 is placed in the transparent state in which light can be transmitted through the thin metal layer 330.

In this state, when voltages of (+) polarity and (−) polarity having a lower level than a predetermined threshold value are applied to the thin metal layer 330 and the thin transparent layer 370 respectively as shown in FIG. 3B, supply of hydrogen ions to the thin metal layer 330 is stopped, and the thin metal layer 330 is placed in the non-transparent state in which the thin metal layer 330 has a predetermined reflectance and transmittance.

Here, when the thin metal layer 330 is placed in the non-transparent state, the thin metal layer 330 reacts with hydrogen ions left in the thin metal layer 330, that is, hydrogen ions not transferred to the electrolyte layer 350.

Finally, when voltages of (+) polarity and (−) polarity having a level of the predetermined threshold value or more are applied to the thin metal layer 330 and the thin transparent layer 370 respectively as shown in FIG. 3C, hydrogen ions present in the thin metal layer 330 are transferred to the electrolyte layer 350, and the thin metal layer 330 is placed in the reflective state in which the thin metal layer 330 can transmit light in only one direction.

Thus, as illustrated in FIG. 2, the transparent smart light source 200A according to the first exemplary embodiment of the present invention can emit light in both directions when the reflectance/transmittance tunable device 300 is in the transparent state, and in only a direction opposite to the reflectance/transmittance tunable device 300 when the reflectance/transmittance tunable device 300 is in the reflective state.

For example, when the transparent smart light source 200A according to the first exemplary embodiment of the present invention is implemented as a window-type lighting device, an illumination direction can be adjusted to only the inside of a building by the reflectance/transmittance tunable device 300 in the reflective state. At this time, the reflectance/transmittance tunable device 300 can serve as a curtain blocking out external light, as well as a lighting device.

Although the structure in which the reflectance/transmittance tunable device 300 is integrated into the transparent OLED 100a has been described in this exemplary embodiment, smart glass capable of adjusting reflectance and transmittance can be fabricated and used as a lower substrate or upper substrate of the transparent OLED 100a.

Also, to reduce the thickness and weight of the transparent smart light source 200A, the first and second glass substrates 310a and 310b of the reflectance/transmittance tunable device 300 can be used as the lower/upper substrates of the transparent OLED 100a.

Figure 4:
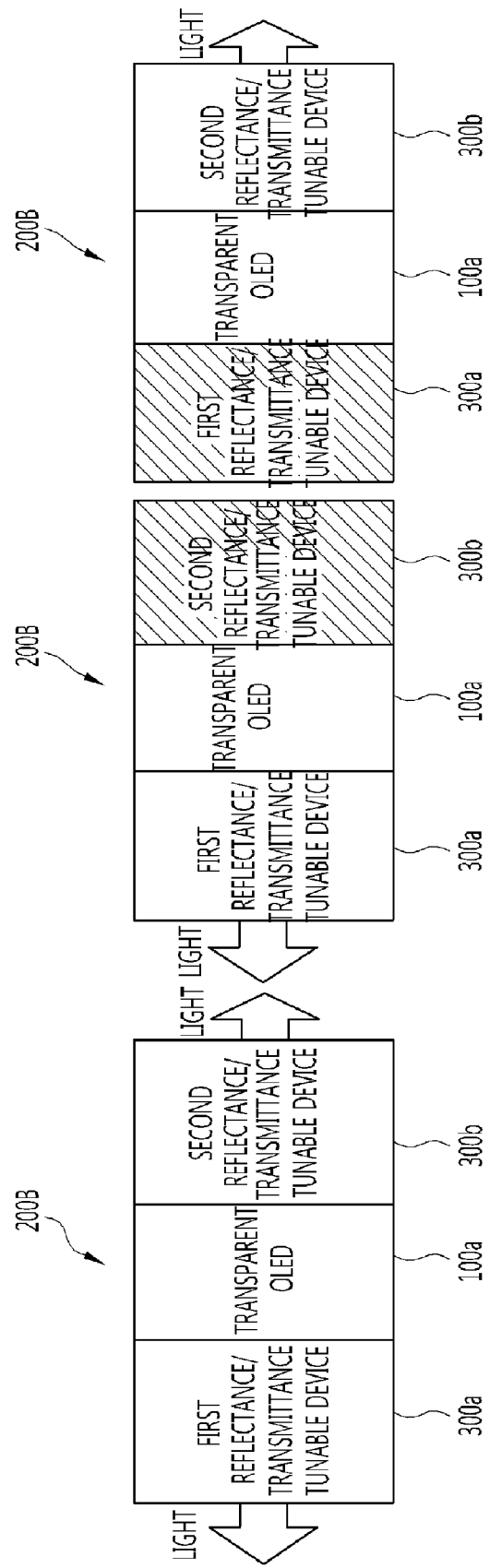
FIG. 4 illustrates a transparent smart light source according to a second exemplary embodiment of the present invention.

FIG. 4 illustrates a transparent smart light source 200B according to a second exemplary embodiment of the present invention.

As illustrated in FIG. 4, in the transparent smart light source 200B according to the second exemplary embodiment of the present invention, first and second reflectance/transmittance tunable devices 300a and 300b are integrated on a lower surface and upper surface of the transparent OLED 100a.

When both of the first and second reflectance/transmittance tunable devices 300a and 300b are in the transparent state, bidirectional light emission is enabled. However, when the second reflectance/transmittance tunable device 300b is in the reflective state, light emission is enabled in the direction of the first reflectance/transmittance tunable device 300a. On the other hand, when the first reflectance/transmittance tunable device 300a is in the reflective state, light emission is enabled in the direction of the second reflectance/transmittance tunable device 300b.

In other words, the transparent smart light source 200B illustrated in FIG. 4 can adjust the illumination direction to one of the lower surface, the upper surface, and both of the upper and lower surfaces using the first and second reflectance/transmittance tunable devices 300a and 300b, and also can adjust the intensity of light in each illumination direction.

Figure 5:
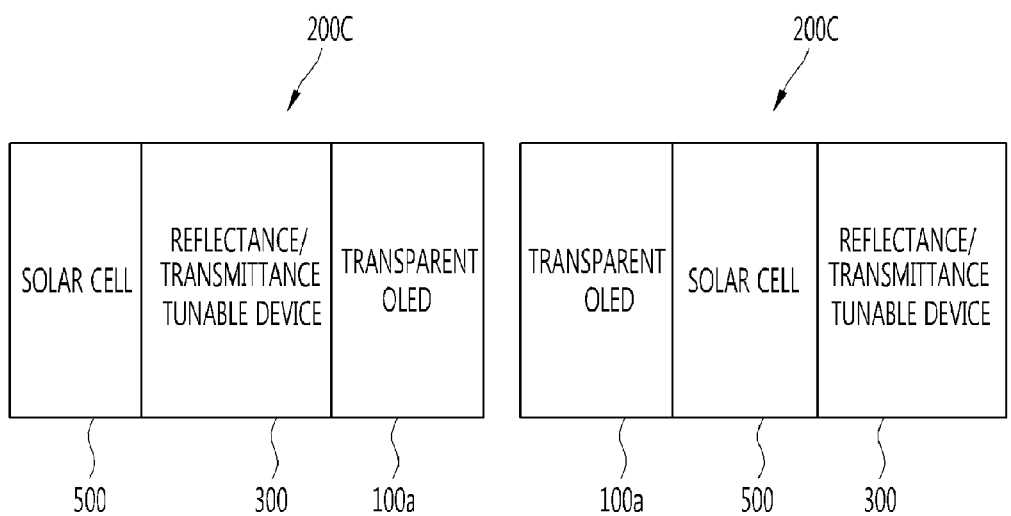
FIG. 5 illustrates a transparent smart light source according to a third exemplary embodiment of the present invention.

FIG. 5 illustrates a transparent smart light source 200C according to a third exemplary embodiment of the present invention.

As illustrated in FIG. 5, a solar cell 500 that generates electric power using sunlight from the outside is included in the transparent smart light source 200C according to the third exemplary embodiment of the present invention.

The solar cell 500 can be formed into a thin film using one of amorphous silicon (a-Si), copper indium gallium selenide (CIGS), an organic material (cadmium telluride). Since the solar cell 500 has the same constitution and operates in the same way as a generally-used transparent battery, the detailed description will be omitted.

In other words, the transparent smart light source 200C can serve as a curtain blocking external light from entering a room as well as a lighting device, and also can generate electric power.

As described above, a transparent smart light source according to an exemplary embodiment of the present invention can adjust the reflectance and transmittance of light emitted from a transparent OLED using a reflectance/transmittance tunable device integrated into the transparent OLED, and thus can simply adjust its illumination direction.

A transparent smart light source according to an exemplary embodiment of the present invention can simply adjust its illumination direction according to purpose. Thus, it is possible to prevent optical loss in an unnecessary direction, and power consumption can be reduced.

Also, a transparent smart light source according to an exemplary embodiment of the present invention can serve as a curtain blocking out external light as well as a lighting device, and also can be combined with a solar cell to generate electric power.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A transparent smart light source capable of adjusting an illumination direction, comprising:
    a transparent organic light-emitting diode (OLED) for bidirectional emission of light, the bidirectional emission including top emission and bottom emission; and
    a reflectance/transmittance tunable device having reflectance/transmittance varying according to a polarity and level of an applied voltage, and reflecting or transmitting the light emitted from the transparent OLED to adjust the illumination direction,
    wherein the reflectance/transmittance of the reflectance/transmittance tunable device varies according to the polarity and level of the applied voltage to place the reflectance/transmittance tunable device in a transparent state, a non-transparent state, or a reflective state, and
    wherein when voltages of (+) polarity and (−) polarity having a lower level than a predetermined threshold value are applied to the reflectance/transmittance tunable device, the reflectance/transmittance tunable device is placed in the non-transparent state so as to have a predetermined reflectance and transmittance.

2. The transparent smart light source of claim 1, wherein the transparent OLED emits light in both directions when the reflectance/transmittance tunable device is in the transparent state, and in a direction opposite to a direction that the reflectance/transmittance tunable device is disposed relative to the OLED when the reflectance/transmittance tunable device is in the reflective state.

3. The transparent smart light source of claim 2, wherein the reflectance/transmittance tunable device includes:
    a first glass substrate;
    a thin metal layer formed on the first glass substrate, for reacting with hydrogen ions to be transparent;
    an electrolyte layer for supplying hydrogen ions to the thin metal layer, or receiving hydrogen ions from the thin metal layer and storing the received hydrogen ions;
    a thin transparent layer formed to correspond to the thin metal layer with the electrolyte layer interposed therebetween; and
    a second glass substrate formed on the thin transparent layer.

4. The transparent smart light source of claim 3, wherein the thin metal layer is formed of Gd—Mg or Mg—Ni, which becomes transparent upon reaction with hydrogen ions.

5. The transparent smart light source of claim 3, wherein when voltages of (−) polarity and (+) polarity are applied to the thin metal layer and the thin transparent layer respectively, the thin metal layer reacts with hydrogen ions supplied from the electrolyte layer to be placed in the transparent state in which light can be transmitted through the thin metal layer.

6. The transparent smart light source of claim 5, wherein when the voltages of (+) polarity and (−) polarity having the lower level than the predetermined threshold value are applied to the reflectance/transmittance tunable device, the voltages of (+) polarity and (−) polarity having the lower level are applied to the thin metal layer and the thin transparent layer respectively, the thin metal layer reacts with hydrogen ions left in the thin metal layer to be placed in the non-transparent state in which the thin metal layer has the predetermined reflectance and transmittance.

7. The transparent smart light source of claim 6, wherein when voltages of (+) polarity and (−) polarity having a level of the predetermined threshold value or more are respectively applied to the thin metal layer and the thin transparent layer to move the hydrogen ions left in the thin metal layer to the electrolyte layer, the thin metal layer is placed in the reflective state in which the thin metal layer reflects external light.

8. The transparent smart light source of claim 3, wherein the electrolyte layer has a first surface and a second surface opposite the first surface, the thin metal layer touches the first surface and the thin transparent layer touches the second surface.

9. The transparent smart light source of claim 1, wherein the reflectance/transmittance tunable device is integrated on at least one of lower and upper surfaces of the transparent OLED.

10. The transparent smart light source of claim 1, further comprising a solar cell for generating electric power using sunlight from the outside.

11. The transparent smart light source of claim 1, wherein the reflectance/transmittance tunable device is smart glass whose reflectance/transmittance vary according to the applied voltage.

12. The transparent smart light source of claim 1, wherein the reflectance/transmittance tunable device is integrated on at least one of a first surface of the transparent OLED and a second surface of the transparent OLED opposite the first surface.

13. The transparent smart light source of claim 1, wherein in the non-transparent state, the reflectance/transmittance tunable device both reflects and transmits the light.

* * * * *